(12) United States Patent
Zhang et al.

(10) Patent No.: US 6,939,749 B2
(45) Date of Patent: Sep. 6, 2005

(54) METHOD OF MANUFACTURING A SEMICONDUCTOR DEVICE THAT INCLUDES HEATING THE GATE INSULATING FILM

(75) Inventors: Hongyong Zhang, Kanagawa (JP); Toru Takayama, Kanagawa (JP); Yasuhiko Takemura, Kanagawa (JP)

(73) Assignee: Semiconductor Energy Laboratory Co., Ltd, Kanagawa-ken (JP)

( * ) Notice: Subject to any disclaimer, the term of this patent is extended or adjusted under 35 U.S.C. 154(b) by 0 days.

(21) Appl. No.: 10/395,387

(22) Filed: Mar. 25, 2003

(65) Prior Publication Data

US 2003/0162337 A1 Aug. 28, 2003

Related U.S. Application Data

(62) Division of application No. 09/903,647, filed on Jul. 13, 2001, now Pat. No. 6,541,313, which is a division of application No. 09/432,109, filed on Nov. 2, 1999, now Pat. No. 6,261,875, which is a division of application No. 08/933,342, filed on Sep. 19, 1997, now Pat. No. 6,060,725, which is a division of application No. 08/449,669, filed on May 24, 1995, now Pat. No. 5,773,846, which is a division of application No. 08/207,182, filed on Mar. 8, 1994, now abandoned.

(30) Foreign Application Priority Data

Mar. 12, 1993 (JP) ............................................. 5-78997
Mar. 12, 1993 (JP) ............................................. 5-78998

(51) Int. Cl.$^7$ ............................................. H01L 21/00

(52) U.S. Cl. ........................ 438/149; 438/781; 438/787

(58) Field of Search ................................ 438/149, 151, 438/162, 164, 181, 211, 257, 299, 301, 517, 778, 780, 781, 787

(56) References Cited

U.S. PATENT DOCUMENTS 4,378,628 A   4/1983   Levinstein et al.

(Continued)

FOREIGN PATENT DOCUMENTS

EP        0 486 284        5/1992

(Continued)

OTHER PUBLICATIONS

Dvurechenskii et al., "Transport Phenomena in Amorphous Silicon Doped by Ion Implantation of 3D Metals", pp. 635–640, 1986 Akademikian Lavrentev Prospekt 13, 630090 Novosibirsk 90, USSR.

(Continued)

*Primary Examiner*—Lynne A. Gurley
*Assistant Examiner*—Stanetta Isaac
(74) *Attorney, Agent, or Firm*—Nixon Peabody LLP; Jeffrey L. Costelia

(57) ABSTRACT

A process for fabricating a thin film transistor, which comprises crystallizing an amorphous silicon film, forming thereon a gate insulating film and a gate electrode, implanting impurities in a self-aligned manner, adhering a coating containing a catalyst element which accelerates the crystallization of the silicon film, and annealing the resulting structure at a temperature lower than the deformation temperature of the substrate to activate the doped impurities. Otherwise, the catalyst element can be incorporated into the structure by introducing it into the impurity region by means of ion implantation and the like. Also a process for fabricating a thin film transistor, which comprises forming a gate electrode, a gate insulating film, and an amorphous silicon film on a substrate, implanting impurities into the amorphous silicon film to form source and drain regions as the impurity regions, introducing a catalyst element into the impurity region by adhering a coating containing the catalyst element of by means of ion doping and the like, and annealing the resulting structure at a temperature lower than the deformation temperature of the substrate to activate the doped impurities.

18 Claims, 4 Drawing Sheets

U.S. PATENT DOCUMENTS

| | | | |
|---|---|---|---|
| 4,619,034 A | | 10/1986 | Janning |
| 4,746,628 A | * | 5/1988 | Takafuji et al. ............. 438/164 |
| 4,772,927 A | | 9/1988 | Saito et al. |
| 4,810,673 A | | 3/1989 | Freeman |
| 4,894,352 A | | 1/1990 | Lane et al. |
| 4,925,812 A | | 5/1990 | Gould |
| 4,943,837 A | | 7/1990 | Konishi et al. |
| 4,965,213 A | | 10/1990 | Blake |
| 5,013,691 A | | 5/1991 | Lory et al. |
| 5,037,766 A | | 8/1991 | Wang |
| 5,064,775 A | | 11/1991 | Chang |
| 5,124,769 A | | 6/1992 | Tanaka et al. |
| 5,141,880 A | | 8/1992 | Inoue et al. |
| 5,147,826 A | | 9/1992 | Liu et al. |
| 5,227,315 A | | 7/1993 | Frisina et al. |
| 5,248,623 A | * | 9/1993 | Muto et al. ................ 438/491 |
| 5,252,502 A | | 10/1993 | Havemann |
| 5,266,507 A | | 11/1993 | Wu |
| 5,275,851 A | | 1/1994 | Fonash et al. |
| 5,275,977 A | | 1/1994 | Otsubo et al. |
| 5,294,555 A | * | 3/1994 | Mano et al. ................ 438/151 |
| 5,300,449 A | | 4/1994 | Okumura |
| 5,313,075 A | | 5/1994 | Zhang et al. |
| 5,313,076 A | | 5/1994 | Yamazaki et al. |
| 5,366,912 A | | 11/1994 | Kobayashi |
| 5,395,804 A | * | 3/1995 | Ueda .......................... 438/166 |
| 5,403,772 A | | 4/1995 | Zhang et al. |
| 5,409,851 A | * | 4/1995 | Oh .............................. 438/159 |
| 5,413,967 A | * | 5/1995 | Matsuda et al. ............ 438/783 |
| 5,466,612 A | * | 11/1995 | Fuse et al. ..................... 438/60 |
| 5,510,146 A | * | 4/1996 | Miyasaka .................... 438/151 |
| 5,523,257 A | | 6/1996 | Yamazaki et al. |
| 5,595,944 A | | 1/1997 | Zhang et al. |
| 5,646,424 A | | 7/1997 | Zhang et al. |
| 5,668,019 A | * | 9/1997 | Kobayashi et al. ......... 438/163 |
| 5,773,846 A | | 6/1998 | Zhang et al. |
| 5,821,138 A | | 10/1998 | Yamazaki et al. |
| 5,837,614 A | | 11/1998 | Yamazaki et al. |
| 5,858,819 A | * | 1/1999 | Miyasaka .................... 438/149 |
| 5,866,932 A | | 2/1999 | Yamazaki et al. |
| 5,936,291 A | * | 8/1999 | Makita et al. ............... 257/405 |
| 6,020,224 A | * | 2/2000 | Shimogaichi et al. ....... 438/158 |
| 6,060,725 A | | 5/2000 | Zhang et al. |
| 6,136,325 A | * | 10/2000 | Linde et al. ............. 424/258.1 |
| 6,261,875 B1 | | 7/2001 | Zhang et al. |
| 6,586,346 B1 | * | 7/2003 | Yamazaki et al. .......... 438/774 |

FOREIGN PATENT DOCUMENTS

| | | |
|---|---|---|
| JP | 59-110115 | 6/1984 |
| JP | 61-063020 | 4/1986 |
| JP | 63-056912 | 3/1988 |
| JP | 63-142807 | 6/1988 |
| JP | 02-042419 | 2/1990 |
| JP | 02-140915 | 5/1990 |
| JP | 03-036768 | 2/1991 |
| JP | 03-166372 | 7/1991 |
| JP | 03-219644 | 9/1991 |
| JP | 04-134869 | 5/1992 |
| JP | 04-190329 | 7/1992 |
| JP | 05-175132 | 7/1993 |
| JP | 05-315355 | 11/1993 |

OTHER PUBLICATIONS

Hempel et al, "Needle–Like Crystallization of Ni Doped Amorphous Silicon Thin Films", pp. 921–924, 1993, Solid State Communications, vol. 85, No. 11.

Hayzelden et al., "In Situ Transmission Electron Microscopy Studies of Suicide–Mediated Crystallization of Amorphous Silicon", 3 pages, 1991.

Kakkad et al., "Crystallized Si Films by Low–Temperature Rapid Thermal Annealing of Amorphous Silicon", pp. 2069–2072, Mar. 1, 1989, J. Appl. Phys., vol. 65, No. 5.

Liu et al., "Polycrystalline Silicon Thin Film Transistors on Corning 7059 Glass Substrates Using Short Time, Low–Temperature Processing" pp. 2554–2556, May 17, 1993, Appl. Phys. Lett., vol. 62, No. 20.

Liu et al., "Selective Area Crystallization of Amorphous Silicon Films by Low–Temperature Rapid Thermal Annealing", pp. 660–662, Aug. 14, 1989, Appl. Phys. Lett., vol. 55, No. 7.

Kakkad et al., "Low Temperature Selective Crystallization of Amorphous Silicon", pp. 66–68, 1989, Journal of Non–Crystalline Solids, vol. 115.

Kawazu et al., "Low–Temperature Crystallization of Hydrogenated Amorphous Silicon Induced by Nickel Silicide Formation", pp. 2698–2704, Dec. 1990, Japanese Journal of Applied Physics, vol. 29, No. 12.

Hayzelden et al., "In Situ Transmission Electron Microscopy Studies of Silicide–Mediated Crystallization of Amorphous Silicon", Appl. Phys. Lett., Jan. 13, 1992, vol. 60, No. 2, pp. 225–227.

* cited by examiner

METHOD OF MANUFACTURING A SEMICONDUCTOR DEVICE THAT INCLUDES HEATING THE GATE INSULATING FILM

BACKGROUND OF THE INVENTION

1. Field of the Invention

The present invention relates to a thin film transistor (TFT) and a process for fabricating the same. The thin film transistor fabricated according to the present invention can be formed on either an insulator substrate such as a glass substrate or a substrate made of, for example, a crystalline silicon. In particular, the present invention relates to a thin film transistor fabricated through steps of crystallization and activation by thermal annealing.

2. Prior Art

Recently, active study is made on semiconductor devices of insulated-gate type comprising an insulator substrate having thereon a thin film active layer (which is sometimes referred to as "active region"). In particular, much effort is paid on the study of insulated-gate transistors of thin film type, i.e., the so-called thin film transistors (TFTs). The TFTs are formed on a transparent insulator substrate, so that they can be employed mainly for controlling each of the pixels or driver circuits of matrix-driven display devices. The TFTs can be classified into, for example, amorphous silicon TFTs and crystalline silicon TFTs, according to the material and the state of the semiconductor employed in the TFT.

Among the TFTs enumerated above, amorphous TFTs can be fabricated without involving a high temperature process. The amorphous TFTs are already put into practice because they yield a high product yield when fabricated on a large area substrate. In general, reverse staggered type (which is also referred to as bottom gate type) amorphous silicon TFTs are used in the practical amorphous silicon TFTs. The amorphous silicon TFTs of this type comprises a gate electrode under the active region.

The process for fabricating the present day TFTs comprises the steps of: forming a gate electrode on a substrate; forming an amorphous silicon film as a gate insulating film and an active layer; and forming an N-type fine-crystalline silicon film on the amorphous silicon film to provide source and drain regions. However, since the N-type silicon film and the amorphous silicon film provided as a base are etched at almost the same etching rate, this process requires an additional step of, for example, providing an etching stopper and the like.

As a means to overcome the above problems, there is proposed a method of forming source and drain by directly implanting high speed ions into the amorphous silicon film using an ion doping process.

However, this method is not yet satisfactory in that it yields ion-implanted regions having particularly impaired crystallinity. These regions yield low electric conductivity and are therefore not suitable for use as they are. There is proposed to increase the crystallinity of these regions by annealing using optical energy from laser beams and the like, however, the method is not applicable to mass production.

Practically useful method at present is crystallizing the amorphous silicon by heating. This method, however, requires annealing at a temperature of 600° C. or higher. Accordingly, this process also is not favorable in view of the problem of substrates. More specifically, an alkali-free glass substrate generally used in amorphous silicon TFTs initiates deformation at a temperature of 600° C. or lower (e.g., a Corning #7059 glass substrate softens at 593° C.). An annealing at 600° C. causes a glass substrate to undergo shrinkage or warping.

Furthermore, an annealing at 600° C. impairs the characteristics of an amorphous silicon TFT which can be advantageously fabricated at low temperatures. More specifically, the active regions also undergo crystallization at 600° C. to completely lose the advantageous characteristics; i.e., the amorphous silicon TFT no longer is characterized by its low leak current. This problem demands the crystallization process to be conducted at a lower temperature (preferably, at a temperature lower than the deformation temperature of glass by 50° C. or more).

In general, semiconductors in an amorphous state have a low electric field mobility. Accordingly, they cannot be used in TFTs in which high speed operation is required. Furthermore, the electric field mobility of a P-type amorphous silicon is extremely low. This makes the fabrication of a P-channel TFT (a PMOS TFT) unfeasible. It then follows that a complementary MOS circuit (CMOS) is not obtainable, because a P-channel TFT must be combined with an N-channel (NMOS TFT) for the implementation of a CMOS.

In contrast to the amorphous semiconductors, crystalline semiconductors have higher electric field mobilities, and are therefore suitable for use in the high speed operation of TFTs. Crystalline silicon is further advantageous in that a CMOS circuit can be easily fabricated therefrom, because not only an NMOS TFT but also a PMOS TFT is available from crystalline silicon. Accordingly, there is proposed an active-matrix driven liquid crystal display having a so-called monolithic structure comprising crystalline TFTs in CMOS, not only in the active matrix portion but also in the peripheral circuit (such as the driver circuit) thereof. These reasons have made the research and development of TFTs using crystalline silicon more active these days.

A crystalline silicon can be obtained from an amorphous silicon by irradiating a laser beam or an intense light having an intensity equivalent thereto. However, this process is not suitable for mass production; it is still unstable because the laser output itself lacks stability and because the process is too short.

A possible practical process for crystallizing amorphous silicon at present is applying heat treatment, i.e., thermal crystallization. This process allows the production of crystalline silicon with uniform quality irrespective of the batches. The process, still, have problems yet to be solved.

In general, thermal crystallization requires performing annealing at about 600° C. for a long duration of time, or at a temperature as high as 1,000° C. or even higher. The latter process narrows the selection of substrate material, because it cannot be applied to cases in which substrates other than those made of quartz are used, and the former treatment also suffer other problems.

More specifically, a process for fabricating a TFT using an inexpensive alkali-free glass substrate (such as a Corning #7059 glass substrate) comprises:

depositing an amorphous silicon film on the substrate;
crystallizing the amorphous silicon film at 600° C. or higher for a duration of 24 hours or longer;
depositing a gate insulating film;
forming a gate electrode;
introducing impurities (by ion implantation or ion doping);

activating the doped impurities at 600° C. or higher and for a duration of 24 hours or longer;

forming interlayer insulators; and forming source and drain regions.

Among the process steps above, the sixth step of activating the doped impurities is found most problematic. Most of alkali-free glasses undergo deformation at the vicinity of 600° C. (e.g., the deformation temperature of Corning #7059 glass is 593° C.). This signifies that the shrinkage of the substrate must be taken into account in this step. In the second step, i.e., the step of annealing, the shrinkage of the substrate is of no problem because the substrate is not patterned yet. However, the substrate in the sixth step has thereon a patterned circuit, and, if the substrate undergoes shrinkage, the mask fitting in the later steps cannot be performed. This considerably lowers the product yield. Conclusively, it has been demanded to perform the sixth step a lower temperature, preferably, at a temperature lower than the glass deformation temperature by 50° C. or more.

The process temperature can be lowered by using laser, as mentioned hereinbefore. However, the process has poor reliability; because of, not only the instability of the laser, but also the generation of stress, ascribed to the difference in temperature rise between the portion to which the laser is irradiated (the source and drain regions) and the portion to which the laser is not irradiated (the active region; i.e., the region under the gate electrode).

It has been therefore believed that the application of laser to the fabrication of TFTs is difficult. Still, no other effective means to overcome the problems could be found to present. The present invention provides a solution to the aforementioned difficulties. That is, the present invention aims to provide a process which overcomes the problems above and yet suitable for mass production.

SUMMARY OF THE INVENTION

As a result of an extensive study of the present inventors, it has been found that the crystallization of a substantially amorphous silicon film can be accelerated by adding a trace amount of a catalyst material. In this manner, the crystallization can be effected at a lower temperature and in a shorter duration of time. Preferred catalyst materials include pure metals, i.e., nickel (Ni), iron (Fe), cobalt (Co), and platinum (Pt), or a compound such as a silicide of an element enumerated herein. More specifically, the process according to the present invention comprises forming, over or under an amorphous silicon film and also in contact therewith, a material containing the catalyst elements in the form of a film, particles, clusters, etc., and thermally annealing the thus formed material for crystallization at a proper temperature, typically at 580° C. or lower, and preferably at 550° C. or lower. Otherwise, instead of forming the material containing the catalyst element in contact with the amorphous silicon film, the catalyst element may be incorporated into the amorphous silicon film by a means such as ion implantation.

Naturally, the duration of crystallization can be shortened by increasing the annealing temperature. Furthermore, the duration of crystallization becomes shorter and the crystallization temperature becomes lower with increasing concentration of nickel, iron, cobalt, or platinum. The present inventors have found, through an extensive study, that the crystallization is accelerated by incorporating at least one of the catalytic elements above at a concentration higher than $1 \times 10^{17}$ cm$^{-3}$, and preferably, at a concentration of $5 \times 10^{18}$ cm$^{-3}$ or higher.

The catalyst materials enumerated above, however, are not favorable for silicon. Accordingly, the concentration thereof are preferably controlled to a level as low as possible. The present inventors have found through the study that the preferred range of the concentration in total is $1 \times 10^{20}$ cm$^{-3}$ or lower. Particularly, in an active layer, the concentration of the catalyst materials must be controlled to $1 \times 10^{18}$ cm$^{-3}$ or lower, preferably, less than $1 \times 10^{17}$ cm$^{-3}$, and more preferably, less than $1 \times 10^{16}$ cm$^{-3}$.

DETAILED DESCRIPTION OF THE PREFERRED EMBODIMENTS

Figure 1A:
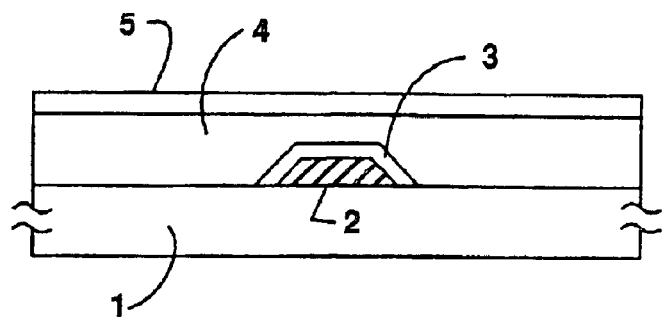
FIGS. 1(A) to 1(E) show schematically drawn step sequential cross section structures obtained in a process according to an embodiment of the present invention (Example 1)

As described in the summary, the present inventors have notified the effect of the catalyst element, and have found that the problems of the prior art processes can be overcome by taking advantage of these elements. A process for fabricating a TFT according to an embodiment of the present invention comprises:

forming a gate electrode;

depositing a gate insulating film;

depositing an amorphous silicon film;

introducing impurities by ion implantation or ion doping into the amorphous silicon film;

forming film of a substance containing a catalyst element on the silicon film;

activating the doped impurities by heat treatment at 550° C. or lower for a duration of within 8 hours; and forming source and drain electrodes.

A process according to another embodiment of the present invention comprises:

forming a gate electrode;

depositing a gate insulating film;

depositing an amorphous silicon film;

introducing impurities by ion implantation or ion doping into the amorphous silicon film;

introducing a catalyst element into the silicon film by ion implantation or ion doping;

activating the doped impurities by heat treatment at 550° C. or lower for a duration of within 8 hours; and forming source and drain electrodes.

In the process steps above, the order of the fourth and the step next thereto can be reversed. That is, the step of doping impurities can be performed before or after the step of introducing the catalyst element. The catalyst element introduced mainly into the source and the drain regions considerably accelerates the crystallization of the regions. Accordingly, the activation can be performed sufficiently at 550° C. or lower, typically, at 500° C. or lower. A duration of 8 hours or less, typically, a duration of 4 hours or less is sufficient for the annealing. In particular, the crystallization is found to proceed extremely swiftly when the catalyst element is introduced into the silicon film using ion implantation or ion doping, because the element is found to be uniformly distributed in the silicon film.

The catalyst elements can be incorporated into the silicon film by using a mask employed in the doping of the impurities. The mask can be obtained in a self-aligned manner by exposure from the back of the gate electrode.

A still other process for fabricating a TFT according to another embodiment of the present invention comprises:

depositing an amorphous silicon film;

crystallizing the amorphous silicon film by heating it at 600° C. or higher for a duration of 24 hours or longer;

depositing a gate insulating film;

forming a gate electrode;

introducing impurities by ion implantation or ion doping into the amorphous silicon film;

depositing a film containing a catalyst element on the silicon film;

activating the doped impurities by heat treatment at 600° C. or lower for a duration of within 8 hours;

forming interlayer insulators; and forming source and drain electrodes.

A yet other process for fabricating a TFT according to an embodiment of the present invention comprises:

depositing an amorphous silicon film;

crystallizing the amorphous silicon film by heating it at 600° C. or higher for a duration of 24 hours or longer;

depositing a gate insulating film;

forming a gate electrode;

introducing impurities by ion implantation or ion doping into the amorphous silicon film;

introducing a catalyst element into the silicon film by ion implantation or ion doping;

activating the doped impurities by heat treatment at 600° C. or lower for a duration of within 8 hours;

forming interlayer insulators; and forming source and drain electrodes.

In the process steps above, the order of the fifth and the step next thereto can be reversed. That is, the step of doping impurities can be performed before or after that of introducing the catalyst element. The catalyst element introduced mainly into; the source and the drain regions considerably accelerates the crystallization of the regions. Accordingly, the activation can be performed sufficiently at 600° C. or lower, typically, at 550° C. or lower. A duration of 8 hours or less, typically, of 4 hours or less is sufficient for the annealing. In particular, the crystallization is found to proceed extremely swiftly when the catalyst element is introduced into the silicon film using ion implantation or ion doping, because the element is found to be uniformly distributed in the silicon film.

The process according to the present invention is characterized in that it comprises adding a catalyst element unfavorable for silicon, but that the concentration thereof in the active region is suppressed to an extremely low level of $1\times10^{18}$ cm$^{-3}$ or lower. That is, all of the aforementioned processes comprises providing a mask or a gate electrode on the active region to use in doping. Accordingly, the catalyst element would not be directly brought into contact with or implanted into the active region. Thus, the reliability and the characteristics of the TFT can be kept without being impaired. In particular, by incorporating nickel into the impurity region at a concentration of 10 times or higher as compared to the active region and by optimally setting the annealing temperature and the duration, the impurity region can be activated while maintaining it in an amorphous state. Since the annealing is performed maintaining thermal equilibrium, no such temperature difference which occurs in laser annealing is encountered.

The present invention is illustrated in greater detail referring to non-limiting examples below. It should be understood, however, that the present invention is not to be construed as being limited thereto.

EXAMPLE 1

FIG. 1 shows the cross section view of the step sequential structures obtained by a process according to an embodiment of the present invention. Referring to FIG. 1, a tantalum film was formed at a thickness of from 3,000 to 8,000 Å, for example, at a thickness of 5,000 Å on a Corning #7059 glass substrate 1, and was patterned to form a gate electrode 2. Then, an anodic oxide film 3 was formed at a thickness of from 1,000 to 3,000 Å, for example, at a thickness of 2,000 Å by anodically oxidizing the surface of the tantalum film. Then, a silicon nitride film 4 was deposited by plasma CVD at a thickness of from 1,000 to 5,000 Å, for example, at a thickness of 1,500 Å. This step was followed by the deposition of an intrinsic (I-type) amorphous silicon film thereon by plasma CVD to a thickness of from 200 to 1,500 Å, for example, to a thickness of 500 Å in this case. The resulting amorphous silicon film was patterned to obtain a semiconductor region 5 as shown in FIG. 1(A).

Figure 1B:
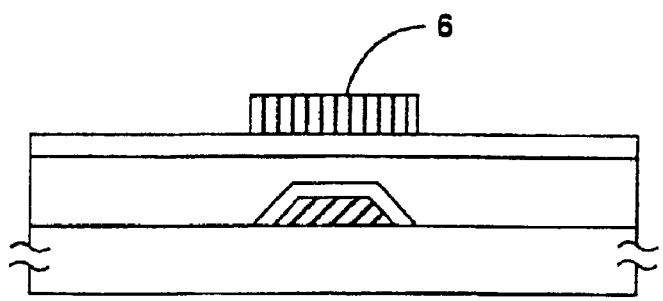

The surface of the resulting substrate was coated with a photoresist, and was exposed from the back of the substrate to form a mask 6 in accordance with the pattern of the gate electrode as shown in FIG. 1(B).

Figure 1C:
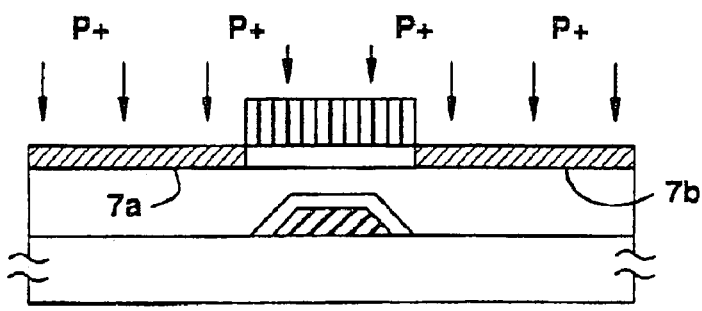

The resulting mask 6 was used to implant phosphorus as an impurity into the semiconductor region 5 by ion doping. Ion doping was performed using phosphine (PH$_3$) as the doping gas, and applying an accelerating voltage in the range of from 60 to 90 kV, for example, at 80 kV, at a dose in the range of from $1\times10^{15}$ to $8\times10^{15}$ cm$^{-2}$. Phosphorus in this case was incorporated at a dose of $2\times10^{15}$ cm$^{-2}$. In this manner, N-type impurity regions 7a and 7b were formed as shown in FIG. 1(C).

Figure 1D:
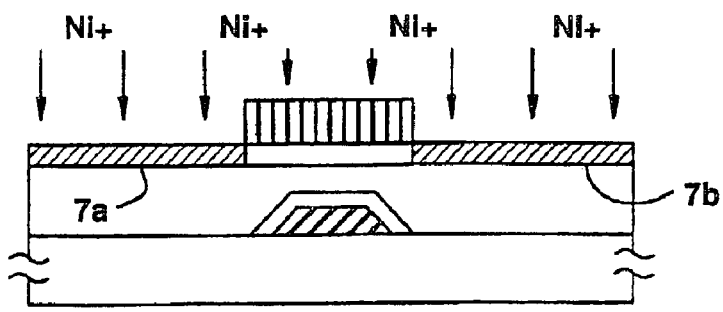

Then, nickel ions were implanted by ion doping using the mask 6. The dose was in the range of from $2\times10^{13}$ to $2\times10^{14}$ cm$^{-2}$, more specifically, at $5\times10^{13}$ cm$^{-2}$ for example. As a result, the concentration of nickel in the N-type impurity regions 26a and 26b was found to be about $5\times10^{18}$ cm$^{-3}$. Thus was obtained a structure as shown in FIG. 1(D).

The resulting structure was then subjected to annealing at 500° C. for a duration of 4 hours in a hydrogen atmosphere containing hydrogen at a partial pressure of, preferably, from 0.1 to 1 atm. In this manner, the impurity was activated. Since nickel ions were previously implanted into the impurity regions, recrystallization was found to proceed acceleratingly in these regions by the catalytic function of nickel on the crystallization. Thus were the impurity regions 7a and 7b activated.

Figure 1E:
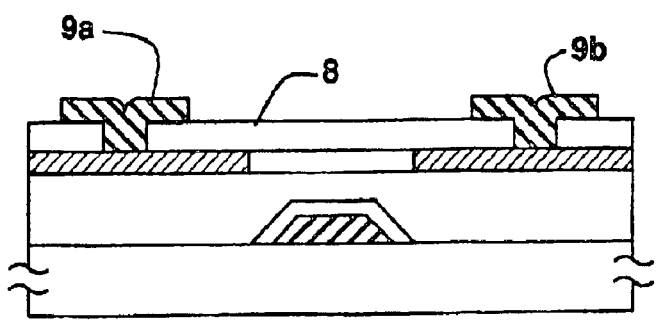

Subsequently, a 3,000 Å thick silicon oxide film 8 was deposited as an interlayer insulator by plasma CVD, and contact holes were formed therein to establish electrodes with interconnections 9a and 9b for the source and the drain regions of the TFT, using a multilayered film comprising metallic materials, such as titanium nitride and aluminum. Thus was implemented a complete thin film transistor as shown in FIG. 1(E).

The nickel concentration of the impurity region and the active region of the TFT thus obtained was measured by means of secondary ion mass spectroscopy (SIMS). The impurity region was found to contain nickel at a concentration of from $1 \times 10^{18}$ to $5 \times 10^{18}$ cm$^{-3}$. This was in clear contrast with the concentration of the active region, which was below the detection limit of $1 \times 10^{16}$ cm$^{-3}$.

EXAMPLE 2

FIG. 2 shows the cross section view of the step sequential structures obtained by a process according to an embodiment of the present invention. Referring to FIG. 2, a tantalum film was formed at a thickness of from 3,000 to 8,000 Å, for example, at a thickness of 5,000 Å on a Corning #7059 glass substrate 11, and was patterned to form a gate electrode 12. Then, an anodic oxide film 13 was formed at a thickness of from 1,000 to 3,000 Å, for example, at a thickness of 2,000 Å by anodically oxidizing the surface of the tantalum film. Then, a silicon nitride film 14 was deposited by plasma CVD at a thickness of from 1,000 to 5,000 Å, for example, at a thickness of 1,500 Å. This step was followed by the deposition of an intrinsic (I-type) amorphous silicon film thereon by plasma CVD to a thickness of from 200 to 1,500 Å, for example, to a thickness of 500 Å in this case. The resulting amorphous silicon film was patterned to obtain a semiconductor region 15 as shown in FIG. 2(A).

Figure 2A:
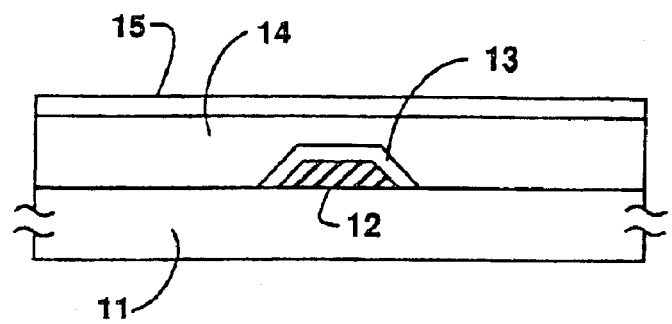
FIGS. 2(A) to 2(E) show schematically drawn step sequential cross section structures obtained in another process according to another embodiment of the present invention (Example 2)
Figure 2B:
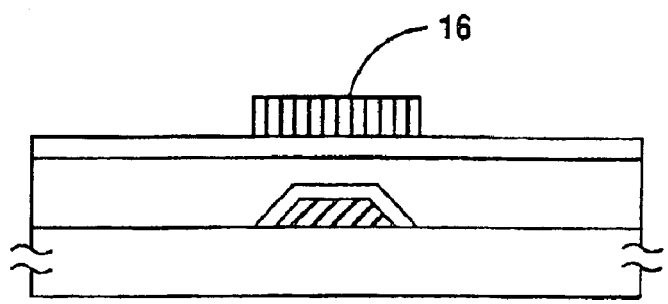

The surface of the resulting substrate was coated with a photoresist, and was exposed from the back of the substrate to form a mask 16 in accordance with the pattern of the gate electrode as shown in FIG. 2(B).

Figure 2C:
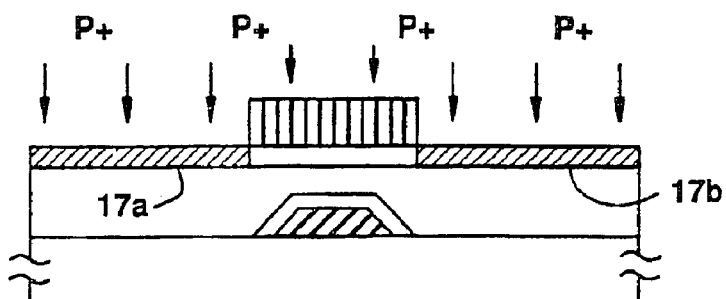

The resulting mask 16 was used to implant phosphorus as an impurity into the semiconductor region 15 by ion doping. Ion doping was performed using phosphine (PH$_3$) as the doping gas, and applying an accelerating voltage in the range of from 60 to 90 kV, for example, at 80 kV, at a dose in the range of from $1 \times 10^{15}$ to $8 \times 10^{15}$ cm$^{-2}$. Phosphorus in this case was incorporated at a dose of $2 \times 10^{15}$ cm$^{-2}$. In this manner, N-type impurity regions 17a and 17b were formed as shown in FIG. 2(C).

Figure 2D:
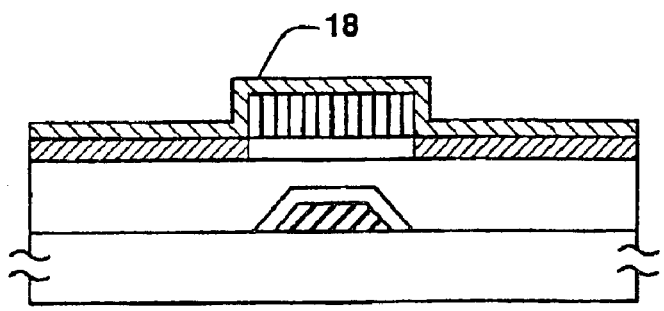

Then, a film of nickel silicide (expressed by chemical formula NiSi$_x$, where x is in the range of from 0.4 to 2.5, for example, 2.0) 18 was deposited over the entire surface by sputtering to a thickness of from 5 to 200 Å, for example, to a thickness of 20 Å. Since the resulting film was as thin as about 20 Å, it looked like an aggregate of particles rather than a continuous film. The appearance of the film is not so important in the present Example. Thus was obtained a structure as shown in FIG. 2(D).

The resulting structure was then subjected to annealing at 450° C. for a duration of 4 hours in a hydrogen atmosphere containing hydrogen, preferably, at a partial pressure of from 0.1 to 1 atm. In this manner, the impurity was activated. Since a nickel suicide film 18 had been previously deposited, nickel atoms diffused therefrom and exerted a catalytic function on the crystallization of the N-type impurity regions 17a and 17b. Thus, recrystallization was found to proceed acceleratingly in these regions to activate the impurity regions 17a and 17b.

Figure 2E:
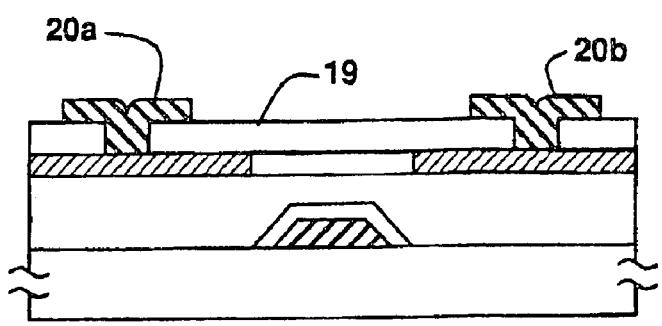

Subsequently, a 3,000 Å thick silicon oxide film 19 was deposited as an interlayer insulator by plasma CVD, and contact holes were formed therein to form electrodes with interconnections 20a and 20b for the source and the drain regions of the TFT, using a multilayered film comprising metallic materials, such as titanium nitride and aluminum. Thus was implemented a complete thin film transistor as shown in FIG. 2(E).

The nickel concentration of the impurity region and the active region of the TFT thus obtained was measured by means of secondary ion mass spectroscopy (SIMS). The impurity region was found to contain nickel at a concentration of from $1 \times 10^{18}$ to $3 \times 10^{18}$ cm$^{-3}$. This was in clear contrast with the concentration of the active region, which was in the range of from $1 \times 10^{16}$ to $5 \times 10^{16}$ cm$^{-3}$.

EXAMPLE 3

FIG. 3 shows the cross section view of the step sequential structures obtained by a process according to another embodiment of the present invention. Referring to FIG. 3, a 2,000 Å thick silicon oxide film ill was formed by sputtering as a base film on a Corning #7059 glass substrate 110. Then, an intrinsic (I-type) amorphous silicon film was deposited thereon by plasma CVD to a thickness of from 500 to 1,500 Å, for example, to a thickness of 1,500 Å. The amorphous silicon film was then crystallized by annealing at 600° C. in nitrogen atmosphere for a duration of 48 hours. After annealing, the silicon film was patterned to form an island-like silicon region 112, and a 1,000 Å thick silicon oxide film 113 was deposited thereon by sputtering as a gate insulating film. The sputtering process was performed in an atmosphere containing oxygen and argon at an argon to oxygen ratio of not higher than 0.5, for example, at a ratio of 0.1 or lower, using silicon oxide as the target. The, substrate during the process was maintained in the temperature range of from 200 to 400° C., for example, at 350° C.

Figure 3A:
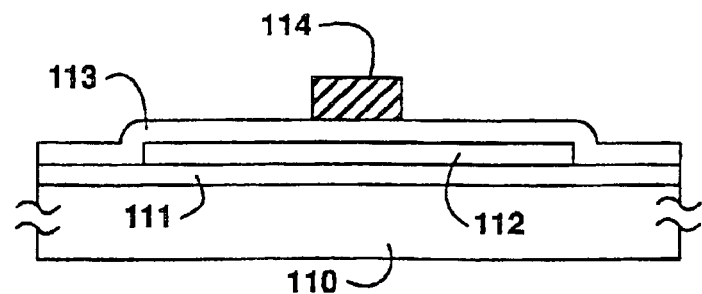
FIGS. 3(A) to 3(E) show schematically drawn step sequential cross section structures obtained in a process according to a further embodiment of the present invention (Example 3)
Figure 3B:
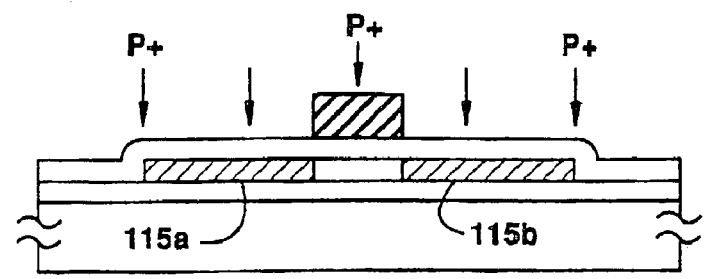

Then, a silicon film containing from 0.1 to 2% of phosphorus was deposited by reduced pressure CVD to a thickness of from 6,000 to 8,000 Å, for example, to a thickness of 6,000 Å. Preferably, the steps of depositing the silicon oxide film and the silicon film are performed continuously. The resulting silicon film was patterned to form a gate electrode 114 as shown in FIG. 3(A).

Phosphorus was then introduced as an impurity by plasma doping into the silicon region using the gate electrode as a mask. The doping was performed using phosphine (PH$_3$) as the doping gas, and applying an accelerating voltage in the range of from 60 to 90 kV, for example, at 80 kV, at a dose in the range of from $1 \times 10^{15}$ to $8 \times 10^{15}$ cm$^{-2}$. Phosphorus in this case was incorporated at a dose of $2 \times 10^{15}$ cm$^{-2}$. In this manner, N-type impurity regions 115a and 115b were formed as shown in FIG. 3 (B).

Figure 3C:
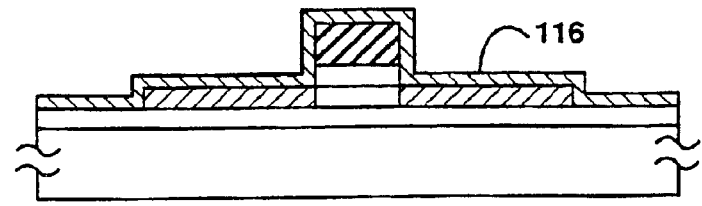

The silicon oxide film 113 on the impurity region was etched to expose the impurity regions 115, and a film of nickel silicide (expressed by chemical formula NiSi$_x$, where x is in the range of from 0.4 to 2.5, for example, 2.0) 116 was deposited over the entire surface by sputtering to a thickness of from 5 to 200 Å, for example, to a thickness of 20 Å. Since the resulting film was as thin as about 20 Å, it looked like an aggregate of particles rather than a continuous film. The appearance of the film is not so important in the present Example. Thus was obtained a structure as shown in FIG. 3(C).

Figure 3D:
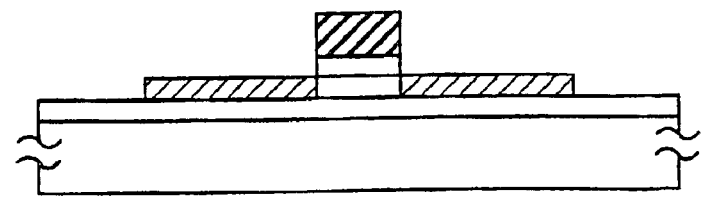

The resulting structure was then subjected to annealing at 500° C. for a duration of 4 hours in a nitrogen atmosphere to activate the impurity. Since nickel diffuses into the N-type impurity regions 115a and 115b from a nickel silicide film previously deposited thereon, recrystallization was found to occur acceleratingly by the annealing. In this manner, the impurity regions 115a and 115b were activated. The resulting structure is shown in FIG. 3(D).

Figure 3E:
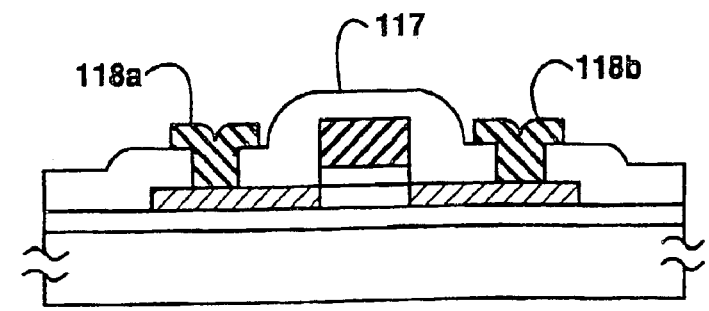

Then, a 6,000 Å thick silicon oxide film 117 was deposited as an interlayer insulator by plasma CVD, and contact holes were perforated therein to form electrodes with interconnections 118a and 118b for the source and the drain regions of the TFT, using a multilayered film comprising metallic materials, such as titanium nitride and aluminum. Finally, the resulting structure was annealed at 350° C. under a hydrogen atmosphere at a pressure of 1 atm for a duration of 30 minutes. Thus was implemented a complete thin film transistor as shown in FIG. 3(E).

The nickel concentration of the source and drain regions and the active region of the TFT thus obtained was measured by means of secondary ion mass spectroscopy (SIMS). The source and drain regions were found to contain nickel at a concentration of from $1 \times 10^{18}$ to $5 \times 10^{18}$ cm$^{-3}$. This was in clear contrast with the concentration of the active region, which was below the detection limit of $1 \times 10^{16}$ cm$^{-3}$.

EXAMPLE 4

FIG. 4 shows the cross section view of the step sequential structures obtained by a process according to another embodiment of the present invention. Referring to FIG. 4, a 2,000 Å thick silicon oxide film 21 was formed by sputtering as a base film on a Corning #7059 glass substrate 29. Then, an intrinsic (I-type) amorphous silicon film was deposited thereon by plasma CVD to a thickness of from 500 to 1,500 Å, for example, to a thickness of 1,500 Å. The amorphous silicon film was then crystallized by annealing at 600° C. in nitrogen atmosphere for a duration of 48 hours. After annealing, the silicon film was patterned to form an island-like silicon region 22.

Then, a 1,000 Å thick silicon oxide film 23 was deposited as a gate insulating film by plasma CVD using tetraethoxysilane (TEOS; $Si(OC_2H_5)_4$) and oxygen as the starting materials. Furthermore, trichloroethylene ($C_2HCl_3$) was added into the starting gas material. Oxygen gas was flown into the chamber at a rate of 400 sccm (standard cubic centimeters per minute) before initiating the film deposition, and plasma was generated inside the chamber while maintaining the total pressure to 5 Pa and the substrate temperature to 300° C., and applying an RF power of 150 W. This state was maintained for a duration of 10 minutes. Then, the silicon oxide film was deposited by introducing oxygen, TEOS, and trichloroethylene into the chamber at a flow rate of 300 sccm, 15 sccm, and 2 sccm, respectively. The substrate temperature, RF power, and the total pressure during the film deposition were maintained at 300° C., 75 W, and 5 Pa, respectively. Upon completion of film deposition, hydrogen gas was introduced into the chamber at such an amount to yield a pressure of 100 Torr to effect hydrogen annealing at 350° C. for 35 minutes.

Figure 4A:
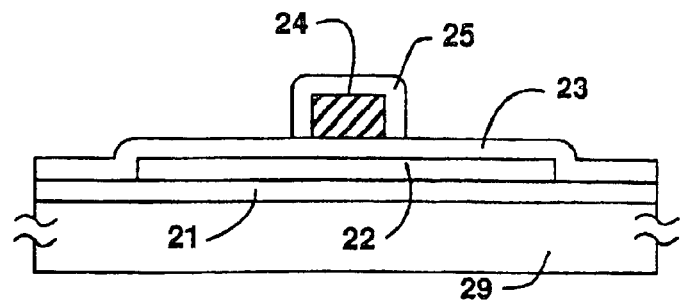
FIGS. 4(A) to 4(E) show schematically drawn step sequential cross section structures obtained in another process according to a still further embodiment of the present invention (Example 4).

Subsequently, a tantalum film was deposited by sputtering at a thickness of from 3,000 to 8,000 Å, for example, at a thickness of 6,000 Å. Titanium, tungsten, molybdenum, or silicon can be used in the place of tantalum. However, the film must have sufficiently high heat resistance to resist against the later activation treatment. Preferably, the deposition steps of the silicon oxide film 23 and the tantalum film are performed continuously. The tantalum film was patterned to form a gate electrode 24 for the TFT. The surface of the tantalum film was further subjected to anodic oxidation to form an oxide layer 25 on the surface thereof. The anodic oxidation was performed in an ethylene glycol solution containing from 1 to 5% of tartaric acid. Thus was obtained an oxide layer 2,000 Å in thickness as shown in FIG. 4(A).

Figure 4B:
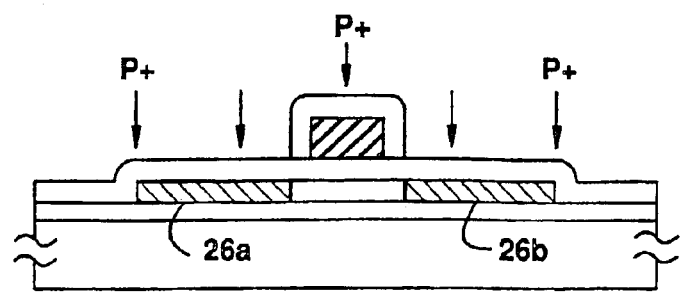

Phosphorus as an impurity was implanted into the silicon region thereafter by plasma doping using the gate electrode as the mask. The doping process was performed using phosphine ($PH_3$) as the doping gas and applying an accelerating voltage of 80 kV. Phosphorus in this case was incorporated at a dose of $2 \times 10^{15}$ cm$^{-2}$. In this manner, N-type impurity regions 26a and 26b were formed. It can be seen that the impurity regions 26 were established offset from the gate electrode 24 in this case as shown in FIG. 4(B).

Figure 4C:
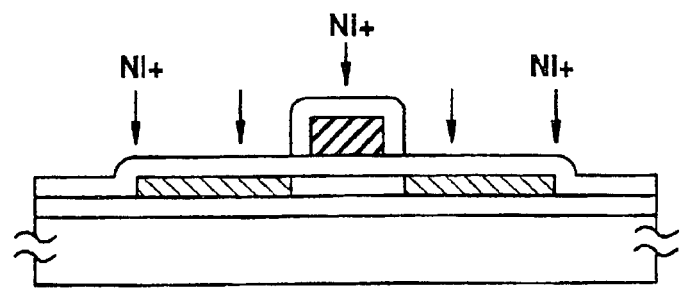

Then, nickel ions were implanted by ion doping using the gate electrode as a mask. Nickel was introduced at a dose in the range of from $2 \times 10^{13}$ to $2 \times 10^{14}$ cm$^{-2}$, more specifically, at a dose of $5 \times 10^{13}$ cm$^{-2}$, for example. As a result, the concentration of nickel in the N-type impurity regions 26a and 26b was found to be about $5 \times 10^{18}$ cm$^{-3}$. Thus was obtained a structure as shown in FIG. 4(C).

Figure 4D:
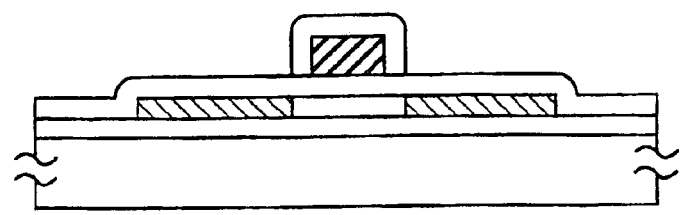

The resulting structure was then subjected to annealing at 500° C. for a duration of 4 hours in a nitrogen atmosphere for the activation of the impurities. Since nickel ions were previously implanted into the N-type impurity regions 26a and 26b, recrystallization was found to proceed acceleratingly in these regions by the catalytic function of nickel on the crystallization. Thus were the impurity regions 26a and 26b activated. The resulting structure is shown in FIG. 4(D).

Figure 4E:
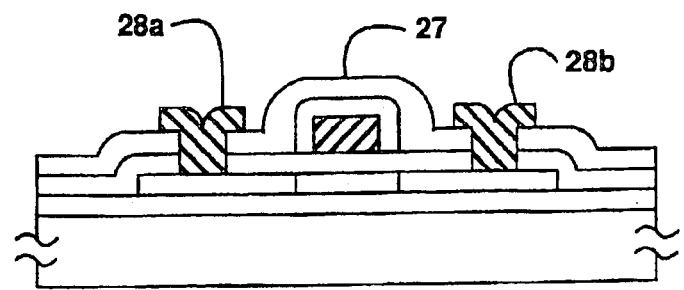

Subsequently, a 2,000 Å hick silicon oxide film 27 was deposited as an interlayer insulator by plasma CVD using TEOS as the starting material, and contact holes were formed therein to form electrodes with interconnections 28a and 28b for the source and the drain regions of the TFT, using a multilayered film comprising metallic materials, such as titanium nitride and aluminum. Thus was implemented a complete semiconductor circuit as shown in FIG. 4(E).

The thus fabricated thin film transistor was found to yield a field-effect mobility in the range of from 70 to 100 cm$^2$/Vs at a gate voltage of 10 V, a threshold voltage of from 2.5 to 4.0 V, and a leak current of $10^{-13}$ Å or lower upon application of a voltage of −20 V to the gate.

The present invention provides thin film transistors with improved throughput by activating the doped impurities at a temperature as low as 500° C. and within a duration as short as 4 hours. Furthermore, the present invention provides a solution to the problems of the prior art technologies; the crystallization effected at such a low temperature above prevents shrinking and warping from occurring on glass substrates, since the deformation of glass substrates had been encountered as serious problems in high temperature processes performed at 600° C. or higher.

The advantages of the present invention enumerated above also enables treating of large area substrates at a time. More specifically, a plurality of semiconductor circuits (such as matrix circuits) can be cut out from a large area substrate. Accordingly, the unit cost of the circuits can be considerably lowered. When applied to the production of liquid crystal displays, the process according to the present invention increases the productivity and provides displays with improved properties. It can be seen from the foregoing that the present invention is of great use in the industry.

While the invention has been described in detail and with reference to specific embodiments thereof, it will be apparent to one skilled in the art that various changes and modifications can be made therein without departing from the spirit and scope thereof.

What is claimed is:

1. A method for manufacturing a semiconductor device comprising the steps of:
   forming a crystalline semiconductor film on an insulating surface;
   forming a gate insulating film comprising silicon oxide by using organic silane over said crystalline semiconductor film;
   heating the gate insulating film in an atmosphere containing hydrogen;
   forming a gate electrode over said gate insulating film, said gate electrode comprising at least one material selected from the group consisting of tantalum, titanium, tungsten, molybdenum and silicon;
   forming at least one impurity region in said crystalline semiconductor film by introducing an impurity element thereto through said gate insulating film;
   forming an insulating film over said gate electrode; and
   forming a wiring comprising aluminum over said insulating film.

2. A method according to claim 1 wherein said impurity element is phosphine.

3. A method according to claim 1 wherein said gate insulating film is formed by a plasma-CVD.

4. A method for manufacturing a semiconductor device comprising the steps of:
   forming a crystalline semiconductor film on an insulating surface; forming a gate insulating film comprising silicon oxide by using organic silane containing halogen over said crystalline semiconductor film;
   heating the gate insulating film in an atmosphere containing hydrogen;
   forming a gate electrode over said gate insulating film, said gate electrode comprising at least one material selected from the group consisting of tantalum, titanium, tungsten, molybdenum and silicon;
   forming at least one impurity region in said crystalline semiconductor film by introducing an impurity element thereto through said gate insulating film;
   forming an insulating film over said gate electrode; and
   forming a wiring comprising aluminum over said insulating film.

5. A method according to claim 4 wherein said impurity element is phosphine.

6. A method according to claim 4 wherein said gate insulating film is formed by a plasma-CVD.

7. A method for manufacturing a semiconductor device comprising the steps of:
   forming a crystalline semiconductor film on an insulating surface;
   forming a gate insulating film comprising silicon oxide by using organic silane over said crystalline semiconductor film;
   heating the gate insulating film in an atmosphere containing hydrogen;
   forming a gate electrode over said gate insulating film, said gate electrode comprising at least one material selected from the group consisting of tantalum, titanium, tungsten, molybdenum and silicon;
   forming at least one impurity region in said crystalline semiconductor film by introducing an impurity element thereto through said gate insulating film;
   forming an insulating film over said gate electrode by using organic silane; and
   forming a wiring comprising aluminum over said insulating film.

8. A method according to claim 7 wherein said impurity element is phosphine.

9. A method according to claim 7 wherein said gate insulating film is formed by a plasma-CVD.

10. A method for manufacturing a semiconductor device comprising the steps of:
    forming a crystalline semiconductor film on an insulating surface;
    forming a gate insulating film comprising silicon oxide by using organic silane over said crystalline semiconductor film;
    heating the gate insulating film in an atmosphere containing hydrogen;
    forming a gate electrode over said gate insulating film, said gate electrode comprising at least one material selected from the group consisting of tantalum, titanium, tungsten, molybdenum and silicon;
    forming at least one impurity region in said crystalline semiconductor film by introducing an impurity element thereto through said gate insulating film;
    activating said impurity element introduced in said crystalline semiconductor film by heating in a nitrogen atmosphere;
    forming an insulating film over said gate electrode; and
    forming a wiring comprising aluminum over said insulating film.

11. A method according to claim 10 wherein said impurity element is phosphine.

12. A method according to claim 10 wherein said gate insulating film is formed by a plasma-CVD.

13. A method for manufacturing a semiconductor device comprising the steps of:
    forming a crystalline semiconductor film on an insulating surface;
    forming a gate insulating film comprising silicon oxide by using organic silane over said crystalline semiconductor film;
    heating the gate insulating film in an atmosphere containing hydrogen;
    forming a gate electrode over said gate insulating film, said gate electrode comprising at least one material selected from the group consisting of tantalum, titanium, tungsten, molybdenum and silicon;
    forming at least one impurity region in said crystalline semiconductor film by introducing an impurity element thereto through said gate insulting film;
    forming an insulating film over said gate electrode;
    forming a contact hole through said insulating film and said gate insulating film; and
    forming a wiring comprising aluminum over said insulating film, said wiring connected to said impurity region through said contact hole.

14. A method according to claim 13 wherein said impurity element is phosphine.

15. A method according to claim 13 wherein said gate insulating film is formed by a plasma-CVD.

16. A method for manufacturing a semiconductor device comprising the steps of:
    forming an underlying insulating film on a substrate;
    forming a crystalline semiconductor film on said underlying insulating film;
    forming a gate insulating film comprising silicon oxide by using organic silane over said crystalline semiconductor film;

heating the gate insulating film in an atmosphere containing hydrogen;

forming a gate electrode over said gate insulating film, said gate electrode comprising at least one material selected from the group consisting of tantalum, titanium, tungsten, molybdenum and silicon;

forming at least one impurity region in said crystalline semiconductor film by introducing an impurity element thereto through said gate insulating film;

forming an insulating film over said gate electrode; and forming a wiring comprising aluminum over said insulating film.

17. A method according to claim 16 wherein said impurity element is phosphine.

18. A method according to claim 16 wherein said gate insulating film is formed by a plasma-CVD.

* * * * *